United States Patent
Liu

(10) Patent No.: US 10,424,607 B2
(45) Date of Patent: Sep. 24, 2019

(54) TFT SUBSTRATE AND MANUFACTURING METHOD THEREOF

(71) Applicant: Wuhan China Star Optoelectronics Technology Co., Ltd., Wuhan (CN)

(72) Inventor: Yuanfu Liu, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/441,245

(22) Filed: Feb. 24, 2017

(65) Prior Publication Data

US 2018/0226438 A1 Aug. 9, 2018

(30) Foreign Application Priority Data

Feb. 7, 2017 (CN) .......................... 2017 1 0067453

(51) Int. Cl.
| | |
|---|---|
| *H01L 27/12* | (2006.01) |
| *H01L 29/786* | (2006.01) |
| *H01L 29/423* | (2006.01) |
| *H01L 29/66* | (2006.01) |

(52) U.S. Cl.
CPC .... *H01L 27/1288* (2013.01); *H01L 29/42384* (2013.01); *H01L 29/66757* (2013.01); *H01L 29/78621* (2013.01); *H01L 29/78633* (2013.01); *H01L 29/78675* (2013.01)

(58) Field of Classification Search
None
See application file for complete search history.

(56) References Cited

U.S. PATENT DOCUMENTS

| | | | | |
|---|---|---|---|---|
| 9,530,799 B2 * | 12/2016 | Wang | ................ | H01L 29/78621 |
| 2011/0171769 A1 * | 7/2011 | You | ...................... | H01L 21/2026 438/34 |
| 2013/0077034 A1 * | 3/2013 | Jung | ..................... | G02F 1/1345 349/122 |
| 2013/0300968 A1 * | 11/2013 | Okajima | ........... | G02F 1/136209 349/43 |
| 2016/0093647 A1 * | 3/2016 | Kim | .................. | G02F 1/136227 349/46 |
| 2016/0351643 A1 * | 12/2016 | Xie | ......................... | H01L 21/77 |
| 2017/0047352 A1 * | 2/2017 | Wang | ................ | H01L 29/78621 |

(Continued)

*Primary Examiner* — Abul Kalam
(74) *Attorney, Agent, or Firm* — Leong C. Lei

(57) ABSTRACT

A manufacturing method of a TFT substrate uses a top gate structure and the entire process can be completely done with seven masks. The number of masks used is reduced. The manufacturing process of a TFT substrate is simplified. Product yield can be increased to effectively improve productivity. Heavy and light ion doping can be simultaneously achieved with one single doping operation so that manufacturing cost can be reduced. By subjecting two ends of a semiconductor pattern to heavy ion doping to form a source electrode and a drain electrode, the manufacturing steps can be reduced and the source electrode and the drain electrode so formed do not need to extend through a via hole formed in an interlayer dielectric layer to contact the two ends of the active layer thereby effectively reducing contact resistance and improving product yield. Also provided is a TFT substrate manufactured with the method.

5 Claims, 13 Drawing Sheets

(56) References Cited

U.S. PATENT DOCUMENTS

| | | | |
|---|---|---|---|
| 2017/0199407 A1* | 7/2017 | Yang | G02F 1/13338 |
| 2017/0207251 A1* | 7/2017 | Liu | H01L 27/1222 |
| 2017/0317189 A1* | 11/2017 | Tu | H01L 29/66757 |
| 2017/0363922 A1* | 12/2017 | Tang | G02F 1/136209 |
| 2018/0004052 A1* | 1/2018 | Tang | G02F 1/136209 |

* cited by examiner

1

TFT SUBSTRATE AND MANUFACTURING METHOD THEREOF

BACKGROUND OF THE INVENTION

1. Field of the Invention

The present invention relates to the field of display technology, and more particular to a thin-film transistor (TFT) substrate and a manufacturing method thereof.

2. The Related Arts

With the progress of the display technology, flat panel display devices, such as liquid crystal displays (LCDs), due to various advantages, such as high image quality, low power consumption, thin device body, and wide range of applications, have been widely used in all sorts of consumer electronic products, including mobile phones, televisions, personal digital assistants (PDAs), digital cameras, notebook computers, and desktop computers, making them the main stream of display devices.

Most of the liquid crystal display devices that are currently available in the market are backlighting LCDs, which comprise a liquid crystal display panel and a backlight module. The working principle of the liquid crystal display panel is that with liquid crystal molecules disposed between two parallel glass substrates and multiple vertical and horizontal tiny conductive wires arranged between the two glass substrates, electricity is applied to control direction change of the liquid crystal molecules for refracting out light emitting from the backlight module to generate an image.

The liquid crystal display panel is made up of a color filter (CF) substrate, a thin-film transistor (TFT) substrate, liquid crystal (LC) interposed between the CF substrate and the TFT substrate, and sealant and is generally manufactured with a process involving an anterior stage of array engineering (for thin film, photolithography, etching, and film peeling), an intermediate stage of cell engineering (for lamination of the TFT substrate and the CF substrate), and a posterior stage of module assembly (for combining a drive integrated circuit (IC) and a printed circuit board). Among these stages, the anterior stage of array engineering generally involves the formation the TFT substrate for controlling the movement of liquid crystal molecules; the intermediate stage of cell engineering generally involves filling liquid crystal between the TFT substrate and the CF substrate; and the posterior stage of module assembly generally involves the combination of the drive IC and the printed circuit board for driving the liquid crystal molecules to rotate for displaying images.

Organic light-emitting diode (OLED) displays, which also referred to organic electroluminescent displays, are a newly emerging flat panel display device and demonstrates prosperous future applications due to advantages including easy manufacturing operation, low cost, low power consumption, high luminous brightness, wide range of adaptation of working temperature, compact size, fast response, each realization of color displaying and large-screen displaying, easy realization of combination with integrated circuit drives, and easy realization of flexible displaying.

An OLED is generally made up of a substrate, an anode arranged on the substrate, a hole injection layer arranged on and anode, a hole transport layer arranged on the hole injection layer, an emissive layer arranged on the hole transport layer, an electron transport layer arranged on the emissive layer, an electron injection layer arranged on the electron transport layer, and a cathode arranged on the electron injection layer. The principle of light emission of an OLED display device is that when a semiconductor material and an organic light emission material are driven by an electric field, carrier currents are injected and re-combine to cause emission of light. Specifically, the OLED display device often uses an indium tin oxide (ITO) pixel electrode and a metal electrode to respectively serve as the anode and cathode of the device and electrons and holes, when driven by a predetermined electrical voltage, are respectively injected into the electron transport layer and the hole transport layer such that the electrons and the holes respectively migrate through the electron transport layer and the hole transport layer to get into the emissive layer and meet in the emissive layer to form excitons that excites light emissive molecules to emit light, the later undergoing radiation relaxation to give off visible light.

Based on the way of driving, OLEDs can be classified in two categories, passive matrix OLED (PMOLED) and active matrix OLED (AMOLED), namely one for direct addressing, and the other for TFT array addressing, among which, the AMOLED comprises pixels that are arranged in an array and belongs to an active display type, having high light emission performance and being commonly used in high definition large-sized display devices.

TFTs are the primary drive elements that are currently used in liquid crystal display devices and active matrix organic light-emitting diode display devices and are directly related to the trend of development of high performance flat panel display devices. Low temperature poly-silicon (LTPS), due to having high electron mobility, may effectively reduce the area of a TFT device so as to improve pixel aperture ratio, increase panel displaying brightness, and also help reduce overall power consumption, allowing the manufacturing cost of the panel to be greatly reduced.

A conventional LTPS TFT often adopts a top gate structure, where a gate is arranged to shield a channel for the purpose of self-shielding in the formation of a lightly doped drain (LDD), in order to reduce overlapping between the gate and the LDD. FIG. 1 is a schematic view illustrating a structure of a conventional LTPS TFT substrate. As shown in FIG. 1, the LTPS TFT substrate comprises, stacked in sequence from bottom to top, a backing plate 100, a light shielding layer 200, a buffer layer 300, an active layer 400, a gate insulation layer 500, a gate electrode 600, an interlayer dielectric layer 700, a source electrode 810 and a drain electrode 820, a planarization layer 900, a common electrode 910, a passivation layer 920, and a pixel electrode 930, wherein the active layer 400 comprises two N-type heavily-doped zones 430 respectively arranged at two opposite ends of the active layer 400, a channel zone 410 located in the middle of the active layer 400, and two N-type lightly-doped zones 420 respectively located between the two N-type heavily-doped zones 430 and the channel zone 410.

In a manufacturing process of the above-described LTPS TFT substrate, a patterning process of the light shielding layer 200, a patterning process of the active layer 400, a doping process of the N-type heavily-doped zone 430, a patterning process of the gate electrode 600 and a doping process of the N-type lightly-doped zones 420, a patterning process of the interlayer dielectric layer 700, a patterning process of the source electrode 810 and the drain electrode 820, a patterning process of the planarization layer 900, a patterning process of the common electrode 910, a patterning process of the passivation layer 920, and a patterning process of the pixel electrode 930 each must be performed with a mask. Thus, the entire process of manufacturing the LTPS TFT substrate requires 10 masks to complete the process. The operations are complicated, the manufacturing cost is relatively high, and product yield is low.

SUMMARY OF THE INVENTION

An objective of the present invention is to provide a manufacturing method of a thin-film transistor (TFT) substrate, which helps reduce the number of mask involved therein, simplifies a process for manufacturing the TFT substrate, and also effectively improves product yield and increase productivity.

Another objective of the present invention is to provide a TFT substrate, of which a manufacturing process requires a reduced number of masks involved therein, making the process of manufacturing simple and product yield and productivity both enhanced.

To achieve the above objectives, the present invention provides a manufacturing method of a TFT substrate, which comprises the following steps:

Step 1: providing a backing plate, depositing a light shielding film on the backing plate, using a first mask to subject the light shielding film to patterning treatment so as to form a light shielding layer;

Step 2: depositing a buffer layer on the light shielding layer and the backing plate, forming a semiconductor layer on the buffer layer, and using a second mask to subject the semiconductor layer to patterning treatment so as to form a semiconductor pattern;

Step 3: depositing, in sequence, a gate insulation layer and a gate conductive film on the semiconductor pattern and the buffer layer and using a third mask to subject the gate insulation layer and the gate conductive film to exposure, development, and etching treatments;

wherein the gate conductive film, after the etching treatment, forms a gate electrode that corresponds to a middle zone of the semiconductor pattern and the gate electrode has a longitudinal cross-section that in the form of a trapezoid; and the gate insulation layer, after the etching treatment, forms a first gate insulation layer and a second gate insulation layer arranged on the first gate insulation layer, wherein the first gate insulation layer covers the semiconductor pattern and the buffer layer, and the second gate insulation layer and the gate electrode correspond to each other;

Step 4: subjecting the gate electrode to etching treatment to reduce a thickness of the gate electrode in order to expose two ends of the second gate insulation layer; and using the gate electrode and the second gate insulation layer so etched as a shielding mask to conduct ion doping on the semiconductor pattern;

wherein two ends of the semiconductor pattern that are not shielded by the gate electrode and the second gate insulation layer are subjected to heavy ion doping so as to form a source electrode and a drain electrode; and portions of a middle zone of the semiconductor pattern that are not shielded by the gate electrode but are shielded by two ends of the second gate insulation layer are subjected to light ion doping and form lightly-ion-doped semiconductor layers; and a portion of the middle zone of the semiconductor pattern that is shielded by both the gate electrode and the second gate insulation layer is not subjected to ion doping and forms a channel-zone semiconductor layer, so that an active layer that comprises the channel-zone semiconductor layer and the lightly-ion-doped semiconductor layers is formed;

Step 5: depositing a first passivation layer on the gate electrode, the first gate insulation layer, and the second gate insulation layer, depositing a planarization layer on the first passivation layer, using a fourth mask to subject the first gate insulation layer, the first passivation layer, and the planarization layer to patterning treatment so as to form a first via in the first gate insulation layer, the first passivation layer, and the planarization layer to correspond to and be located above the drain electrode;

Step 6: depositing a first transparent conductive film on the planarization layer and using a fifth mask to subject the first transparent conductive film to patterning treatment so as to form a common electrode;

Step 7: depositing a second passivation layer on the common electrode and the planarization layer and using a sixth mask to subject the second passivation layer to patterning treatment so as to form a second via in the second passivation layer to be located above and corresponding to the drain electrode and arranged inside the first via; and Step 8: depositing a second transparent conductive film on the second passivation layer and using a seventh mask to subject the second transparent conductive film to patterning treatment so as to form a pixel electrode, wherein the pixel electrode is connected through the second via to the drain electrode.

In Step 2, the step of forming a semiconductor layer on the buffer layer comprises: depositing an amorphous silicon layer on the buffer layer and applying a crystallization process to convert the amorphous silicon layer into a poly-silicon layer, wherein the poly-silicon layer serves as the semiconductor layer.

In Step 4, the semiconductor pattern is subjected to doping with N-type ions and the N-type ions used are phosphorous ions.

Doping ion concentrations in the source electrode and the drain electrode are $1 \times 10^{14}$-$8 \times 10^{15}$ ions/cm$^3$, and doping ion concentration in the lightly-ion-doped semiconductor layers is $5 \times 10^{12}$-$9 \times 10^{13}$ ions/cm$^3$.

The backing plate comprises a glass plate; the light shielding layer and the gate electrode are each formed of a material comprising at least one of molybdenum, aluminum, copper, titanium, tungsten, and alloys thereof; the first passivation layer and the second passivation layer each comprise a silicon nitride layer or a stacked composite layer of a silicon nitride layer and a silicon oxide layer; the planarization layer is formed of a material comprising a transparent organic insulation material; and the common electrode and the pixel electrode are formed of materials that comprise indium tin oxide.

The present invention also provides a TFT substrate, which comprises, stacked in sequence from bottom to top, a backing plate, a light shielding layer, a buffer layer, an active layer and the source electrode and the drain electrode, a first gate insulation layer, a second gate insulation layer, a gate electrode, a first passivation layer, a planarization layer, a common electrode, a second passivation layer, and a pixel electrode;

wherein the source electrode and the drain electrode are respectively located at two opposite sides of the active layer and in connection therewith, the source electrode and the drain electrode being both formed by subjecting a semiconductor to heavy ion doping, the active layer comprising two lightly-ion-doped semiconductor layers respectively located at two ends thereof and connected with the source electrode and the drain electrode and a channel-zone semiconductor layer located between the two lightly-ion-doped semiconductor layers;

the first gate insulation layer covers the active layer, the source electrode, the drain electrode, and the buffer layer; the second gate insulation layer and the active layer correspond to each other; and the gate electrode and the channel-zone semiconductor layer correspond to each other; and the first gate insulation layer, the first passivation layer, and the planarization layer comprise a first via formed therein to correspond to and be located above the drain electrode; the second passivation layer comprises a second via formed therein to correspond to and be located above the drain electrode and located inside the first via, the pixel electrode being connected through the second via to the drain electrode.

The source electrode, the drain electrode, the lightly-ion-doped semiconductor layers, and the channel-zone semiconductor layer are formed of a poly-silicon layer.

The source electrode, the drain electrode, and the lightly-ion-doped semiconductor layers are doped with ions that are N-type ions, and the N-type ions are phosphorous ions.

Doping ion concentrations in the source electrode and the drain electrode are $1\times10^{14}$-$8\times10^{15}$ ions/cm$^3$, and doping ion concentration in the lightly-ion-doped semiconductor layers is $5\times10^{12}$-$9\times10^{13}$ ions/cm$^3$.

The backing plate comprises a glass plate; the light shielding layer and the gate electrode are each formed of a material comprising at least one of molybdenum, aluminum, copper, titanium, tungsten, and alloys thereof; the first passivation layer and the second passivation layer each comprise a silicon nitride layer or a stacked composite layer of a silicon nitride layer and a silicon oxide layer; the planarization layer is formed of a material comprising a transparent organic insulation material; and the common electrode and the pixel electrode are formed of materials that comprise indium tin oxide.

The efficacy of the present invention is that the present invention provides a TFT substrate and a manufacturing method thereof. The manufacturing method of a TFT substrate according to the present invention uses a top gate structure to manufacture the TFT substrate. The entire process can be completely done with seven masks, and, compared to the prior art, the number of masks used is effectively reduced, the manufacturing process of the TFT substrate is simplified, and product yield is effectively increased to improve productivity. A heavy ion doping process and a light ion doping process can be simultaneously achieved with one single ion doping operation so that the manufacturing cost can be reduced. By subjecting the two ends of the semiconductor pattern to heavy ion doping to form the source electrode and the drain electrode, the manufacturing steps can be reduced and the source electrode and the drain electrode so formed do not need to extend through a via hole formed in an interlayer dielectric layer to get in connection with the two ends of the active layer so that contact resistance can be effectively reduced and product yield is improved. The TFT substrate according to the present invention provides involves a top gate structure. The entire TFT substrate can be manufactured with seven masks, and compared to the prior art, the number of masks used is reduced, a manufacturing process of the TFT substrate is simplified, and product yield and productivity are effectively improved. The source electrode and the drain electrode of the TFT substrate are both formed by subjecting a semiconductor to heavy ion doping so that the manufacturing steps of the TFT substrate can be reduced and the source electrode and the drain electrode do not need to extend through a via hole formed in an interlayer dielectric layer to get in connection with the two ends of the active layer so that contact resistance can be effectively reduces and product yield is improved.

For better understanding of the features and technical contents of the present invention, reference will be made to the following detailed description of the present invention and the attached drawings. However, the drawings are provided only for reference and illustration and are not intended to limit the present invention.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings:

FIGS. 17 and 18 are schematic views illustrating Step 8 of the manufacturing method of the TFT substrate according to the present invention, in which FIG. 18 is also a schematic view illustrating a structure of the TFT substrate according to the present invention.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
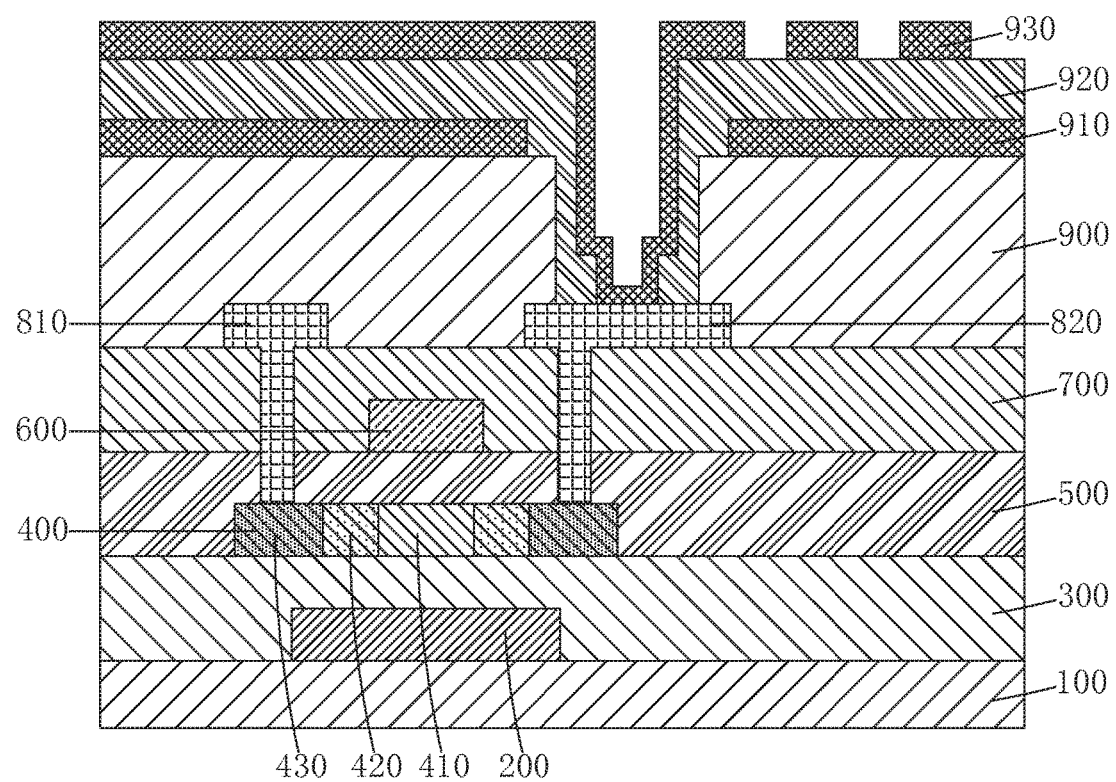
FIG. 1 is a schematic view illustrating a structure of a conventional low temperature poly-silicon (LTPS) thin-film transistor (TFT) substrate.
Figure 2:
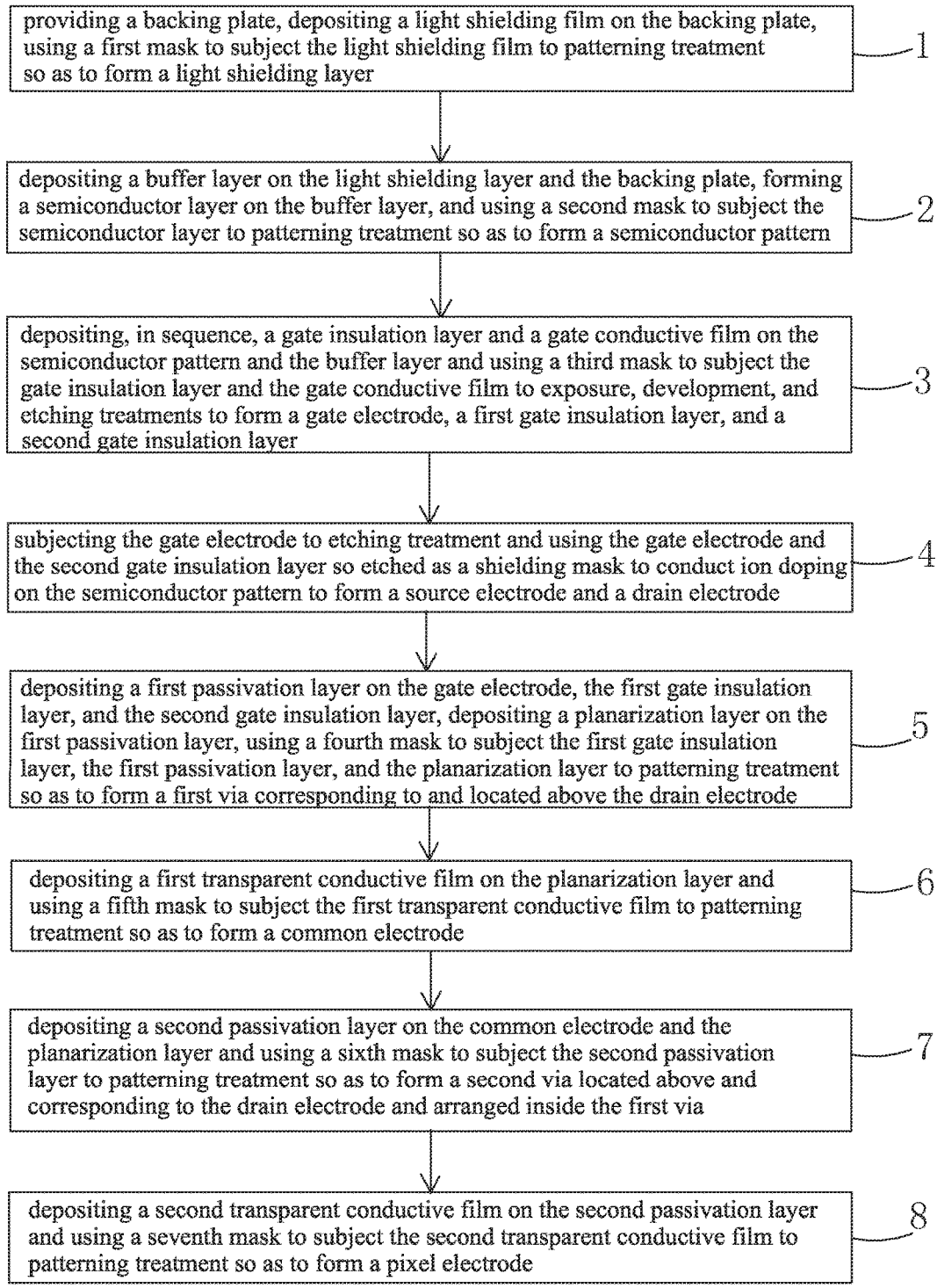
FIG. 2 is a flow chart illustrating a manufacturing method of a TFT substrate according to the present invention.
Figure 3:
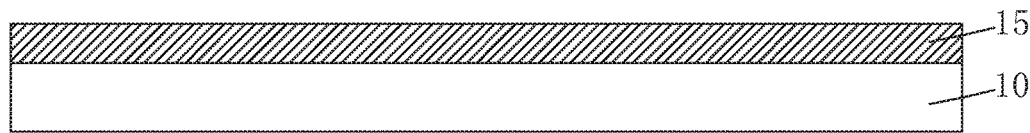
FIGS. 3 and 4 schematic views illustrating Step 1 of the manufacturing method of the TFT substrate according to the present invention.
Figure 4:
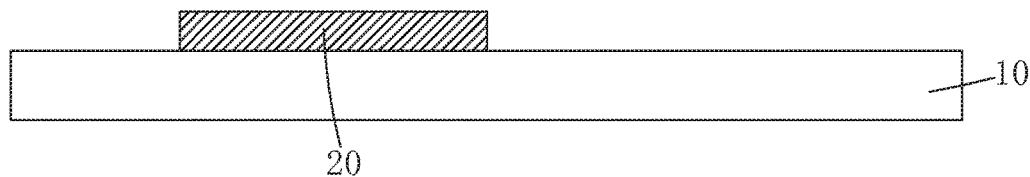

Referring to FIG. 2, the present invention provides a manufacturing method of a thin-film transistor (TFT) substrate, which comprises the following steps:

Step 1: as shown in FIGS. 3 and 4, providing a backing plate 10, depositing a light shielding film 15 on the backing plate 10, using a first mask 11 to subject the light shielding film 15 to patterning treatment so as to form a light shielding layer 20.

Specifically, the backing plate 10 comprises a glass plate.

Specifically, the light shielding layer 20 is formed of a material comprising at least one of molybdenum (Mo), aluminum (Al), copper (Cu), titanium (Ti), tungsten (W), and alloys thereof.

Figure 5:
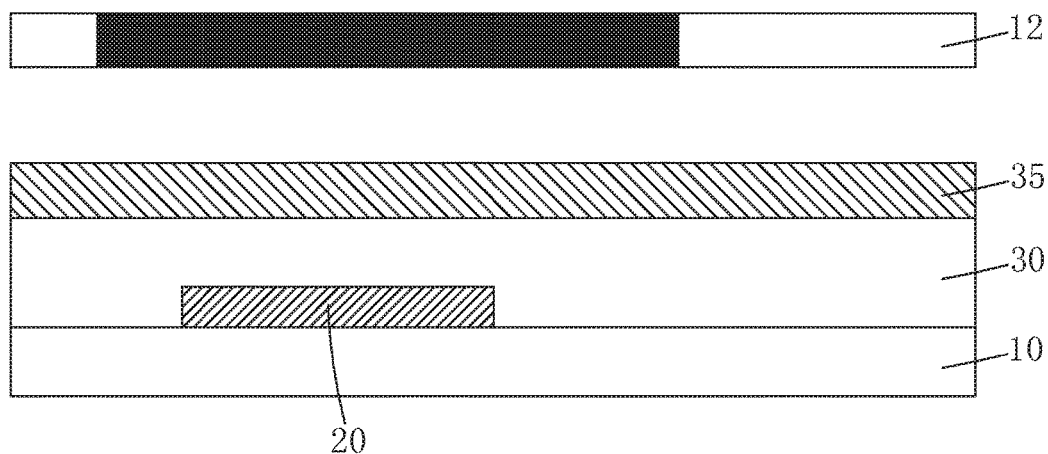
FIGS. 5 and 6 are schematic views illustrating Step 2 of the manufacturing method of the TFT substrate according to the present invention.
Figure 6:
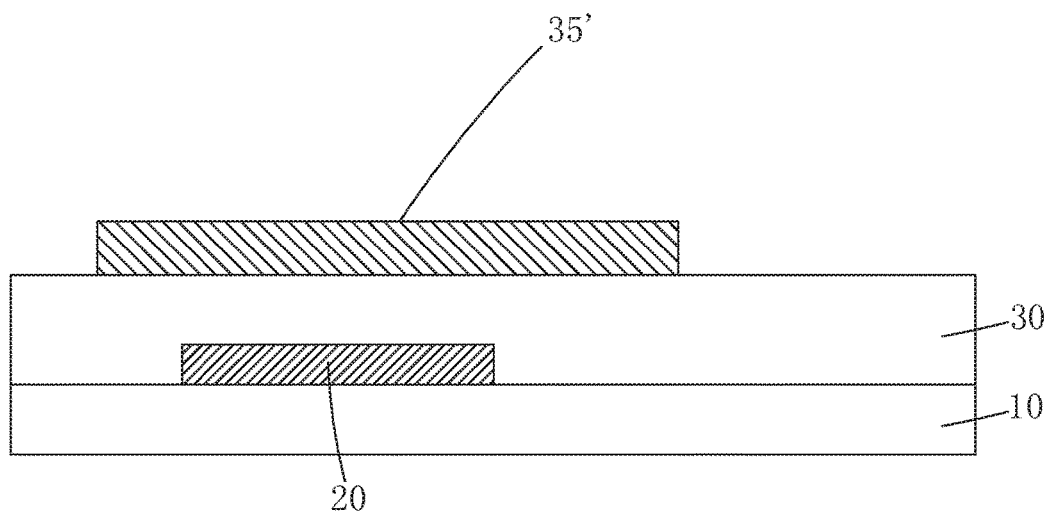

Step 2: as shown in FIGS. 5 and 6, depositing a buffer layer 30 on the light shielding layer 20 and the backing plate 10, forming a semiconductor layer 35 on the buffer layer 30, and using a second mask 12 to subject the semiconductor layer 35 to patterning treatment so as to form a semiconductor pattern 35'.

Specifically, in Step 2, the step of forming a semiconductor layer 35 on the buffer layer 30 comprises: depositing an amorphous silicon layer on the buffer layer 30 and applying a crystallization process to convert the amorphous silicon layer into a poly-silicon layer, wherein the poly-silicon layer serves as the semiconductor layer 35.

Figure 7:
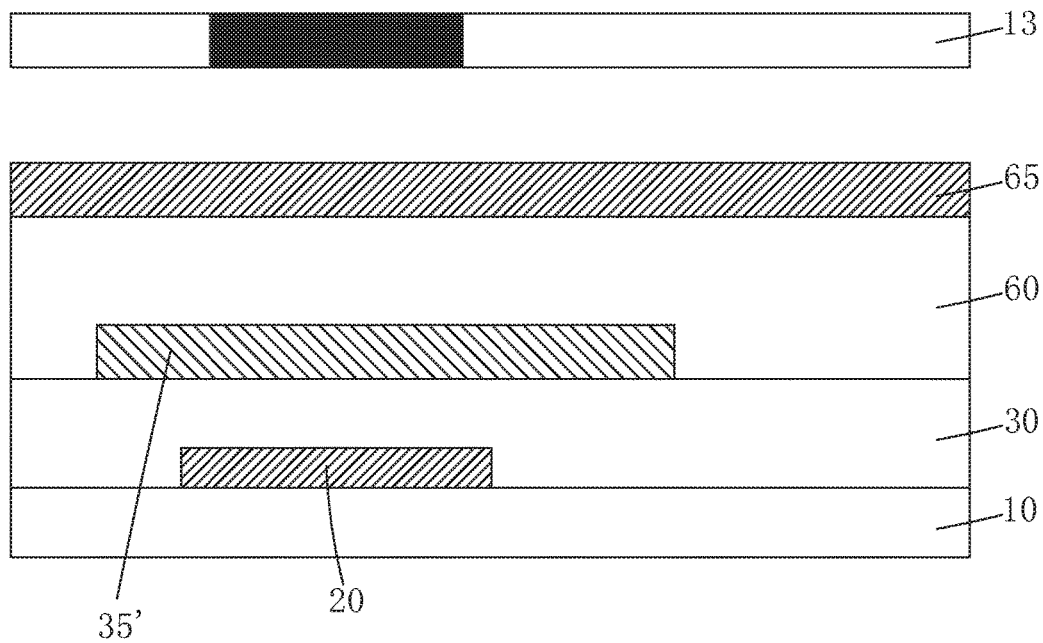
FIGS. 7 and 8 are schematic views illustrating Step 3 of the manufacturing method of the TFT substrate according to the present invention.
Figure 8:
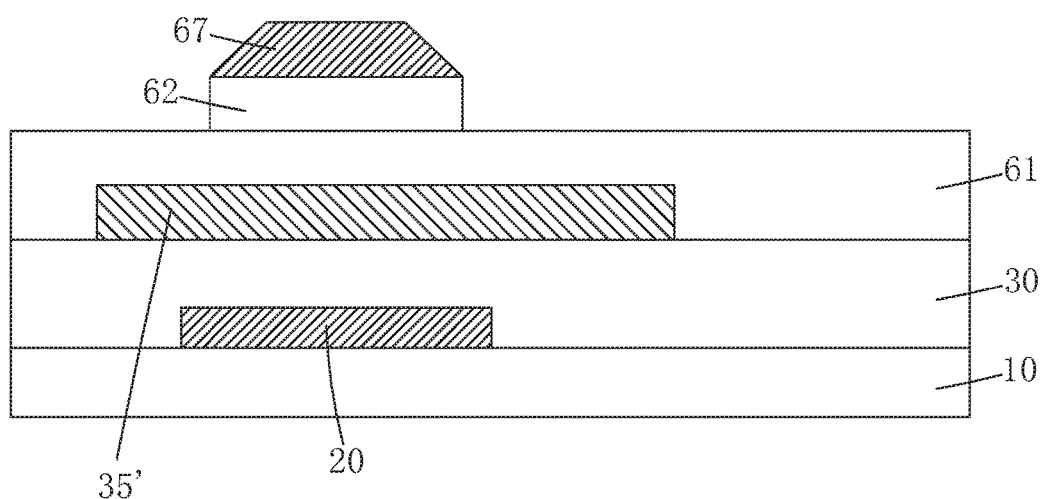

Step 3: as shown in FIGS. 7 and 8, depositing, in sequence, a gate insulation layer 60 and a gate conductive film 65 on the semiconductor pattern 35' and the buffer layer 30 and using a third mask 13 to subject the gate insulation layer 60 and the gate conductive film 65 to exposure, development, and etching treatments;

wherein the gate conductive film 65, after the etching treatment, forms a gate electrode 67 that corresponds to a middle zone of the semiconductor pattern 35' and the gate electrode 67 has a longitudinal cross-section that in the form of a trapezoid; and the gate insulation layer 60, after the etching treatment, forms a first gate insulation layer 61 and a second gate insulation layer 62 arranged on the first gate insulation layer 61, wherein the first gate insulation layer 61 covers the semiconductor pattern 35' and the buffer layer 30, and the second gate insulation layer 62 and the gate electrode 67 correspond to each other.

Specifically, in Step 3, etching processes applied to the gate insulation layer 60 and the gate conductive film 65 are both dry etching; and the etching process applied to the gate insulation layer 60 can be the same etching process as that applied to the gate conductive film 65, namely using the same etchant gas, or alternatively, they can be two different etching processes, namely using different etchant gases.

Specifically, in Step 3, a thickness of the second gate insulation layer 62 can be controlled by controlling extent of etching of the gate insulation layer 60 so that in an ion doping process applied in a subsequent Step 4, controlling of the thickness of the second gate insulation layer 62 is useful in controlling an effect thereof in blocking ions so as to control doping ion concentration applied in lightly-ion-doped semiconductor layers 42.

Specifically, the second gate insulation layer 62 has a thickness of 100 Å-1000 Å.

Specifically, the gate electrode 67 is formed of a material comprising at least one of molybdenum (Mo), aluminum (Al), copper (Cu), titanium (Ti), tungsten (W), and alloys thereof.

Figure 9:
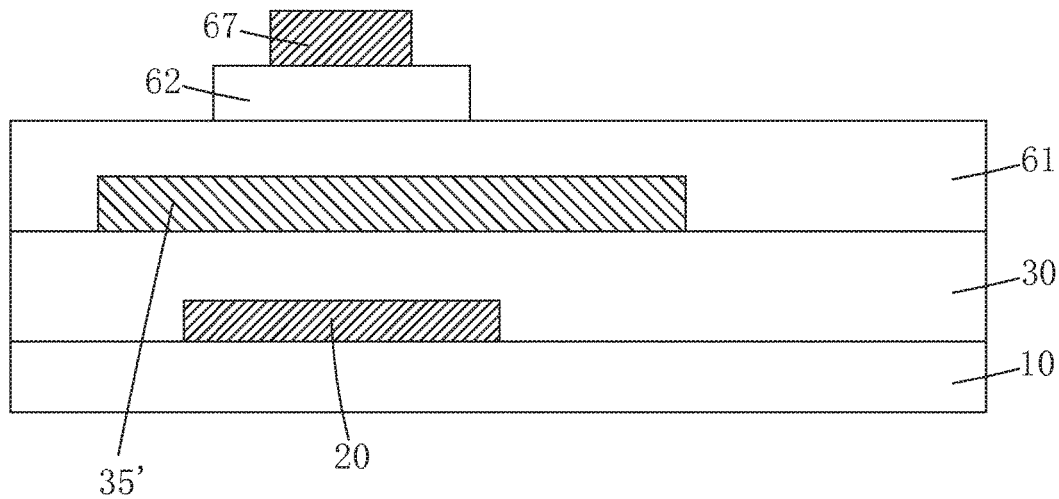
FIGS. 9 and 10 are schematic views illustrating Step 4 of the manufacturing method of the TFT substrate according to the present invention.
Figure 10:
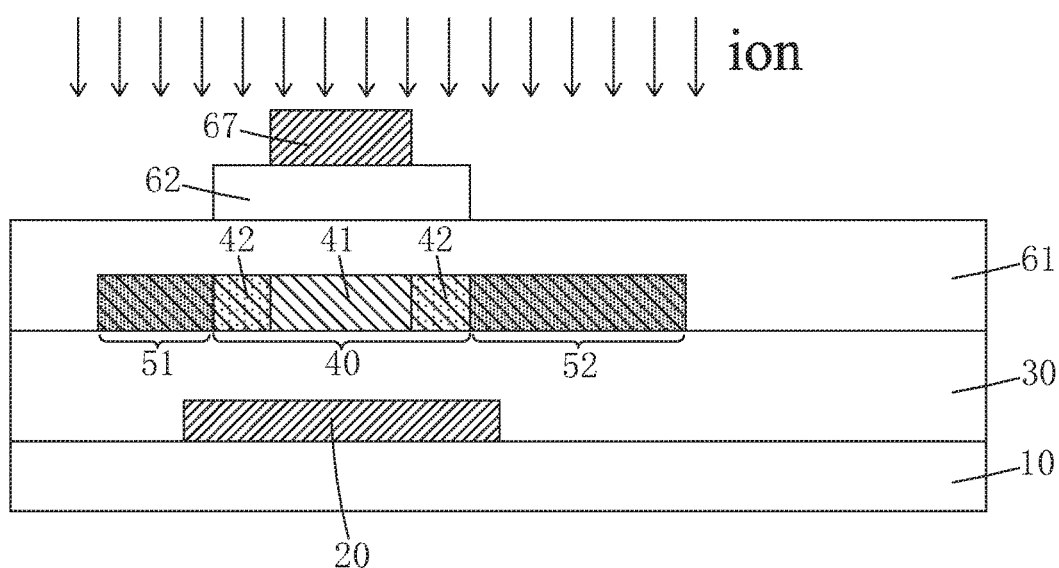

Step 4: as shown in FIG. 9, subjecting the gate electrode 67 to etching treatment to reduce a thickness of the gate electrode 67 in order to expose two ends of the second gate insulation layer 62; and as shown in FIG. 10, using the gate electrode 67 and the second gate insulation layer 62 so etched as a shielding mask to conduct ion doping on the semiconductor pattern 35';

wherein two ends of the semiconductor pattern 35' that are not shielded by the gate electrode 67 and the second gate insulation layer 62 are subjected to heavy ion doping so as to form a source electrode 51 and a drain electrode 52; and portions of a middle zone of the semiconductor pattern 35' that are not shielded by the gate electrode 67 but are shielded by two ends of the second gate insulation layer 62 are subjected to light ion doping and form lightly-ion-doped semiconductor layers 42; and a portion of the middle zone of the semiconductor pattern 35' that is shielded by both the gate electrode 67 and the second gate insulation layer 62 is not subjected to ion doping and forms a channel-zone semiconductor layer 41, so that an active layer 40 that comprises the channel-zone semiconductor layer 41 and the lightly-ion-doped semiconductor layers 42 is formed.

Step 4 achieves both a heavy ion doping process and a light ion doping process with one single ion doping operation so that the manufacturing cost is effectively reduced.

Specifically, in Step 4, the etching process applied to the gate electrode 67 is dry etching. An etchant gas of the dry etching process imposes an effect of etching only on the gate electrode 67 and does not impose an effect of etching on the first gate insulation layer 61 and the second gate insulation layer 62.

Specifically, in Step 4, in the etching process of the gate electrode 67, since the thickness of the trapezoidal cross-section of the gate electrode 67 is gradually reduced toward edges of two slops thereof, a portion that has the smallest thickness would be first etched off during the etching process and thus, widths of the two slopes of the gate electrode 67 would be gradually reduced toward zero thereby making a width of the gate electrode 67 gradually reduced. Specifically, by controlling etching speed and etching time of the dry etching process, it is possible to control the width of the gate electrode 67 to reduce to a predetermined length.

Specifically, in Step 4, the semiconductor pattern 35' is subjected to N-type ion doping and the N-type ions used are phosphorous ions.

Specifically, doping ion concentrations in the source electrode 51 and the drain electrode 52 are $1 \times 10^{14}$-$8 \times 10^{15}$ ions/cm$^3$, making the source electrode 51 and the drain electrode 52 excellent in electrical conduction property.

Specifically, doping ion concentration in the lightly-ion-doped semiconductor layers 42 is $5 \times 10^{12}$-$9 \times 10^{13}$ ions/cm$^3$.

Figure 11:
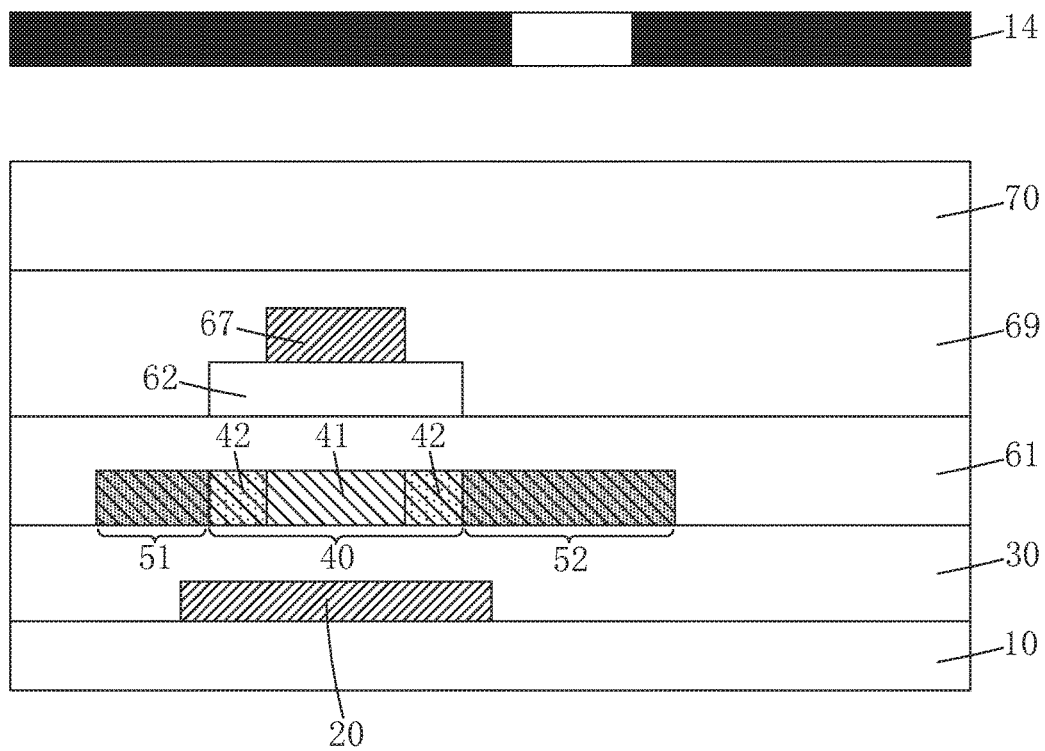
FIGS. 11 and 12 are schematic views illustrating Step 5 of the manufacturing method of the TFT substrate according to the present invention.
Figure 12:
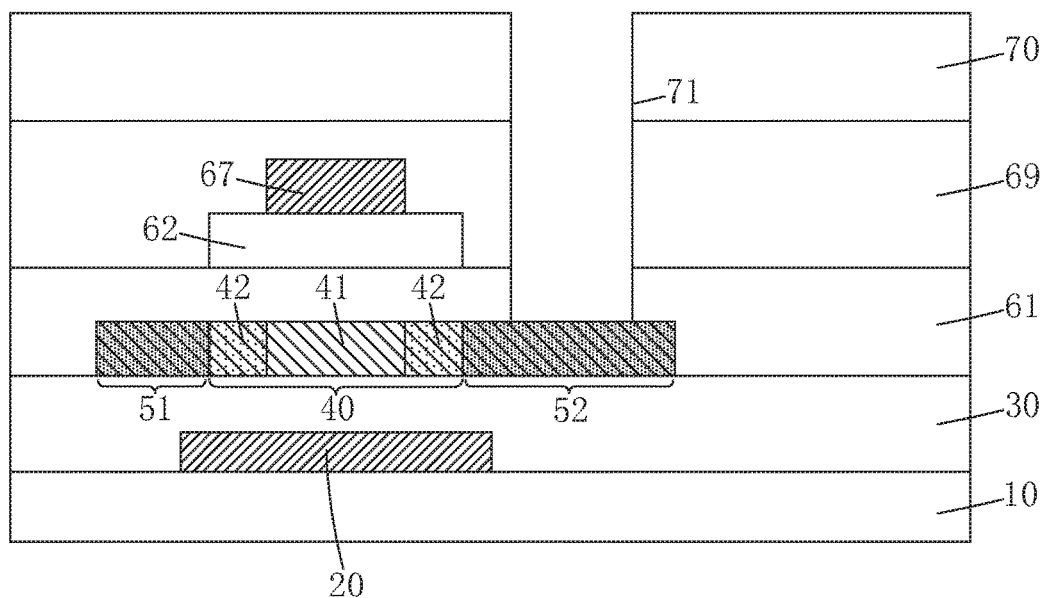

Step 5: as shown in FIGS. 11 and 12, depositing a first passivation layer 69 on the gate electrode 67, the first gate insulation layer 61, and the second gate insulation layer 62, depositing a planarization layer 70 on the first passivation layer 69, using a fourth mask 14 to subject the first gate insulation layer 61, the first passivation layer 69, and the planarization layer 70 to patterning treatment so as to form a first via 71 in the first gate insulation layer 61, the first passivation layer 69, and the planarization layer 70 to correspond to and be located above the drain electrode 52.

Specifically, the first passivation layer 69 comprises a silicon nitride (SiN$_x$) layer or a stacked composite layer of a silicon nitride layer and a silicon oxide (SiO$_x$) layer.

Specifically, the planarization layer 70 is formed of a material comprising a transparent organic insulation material.

Figure 13:
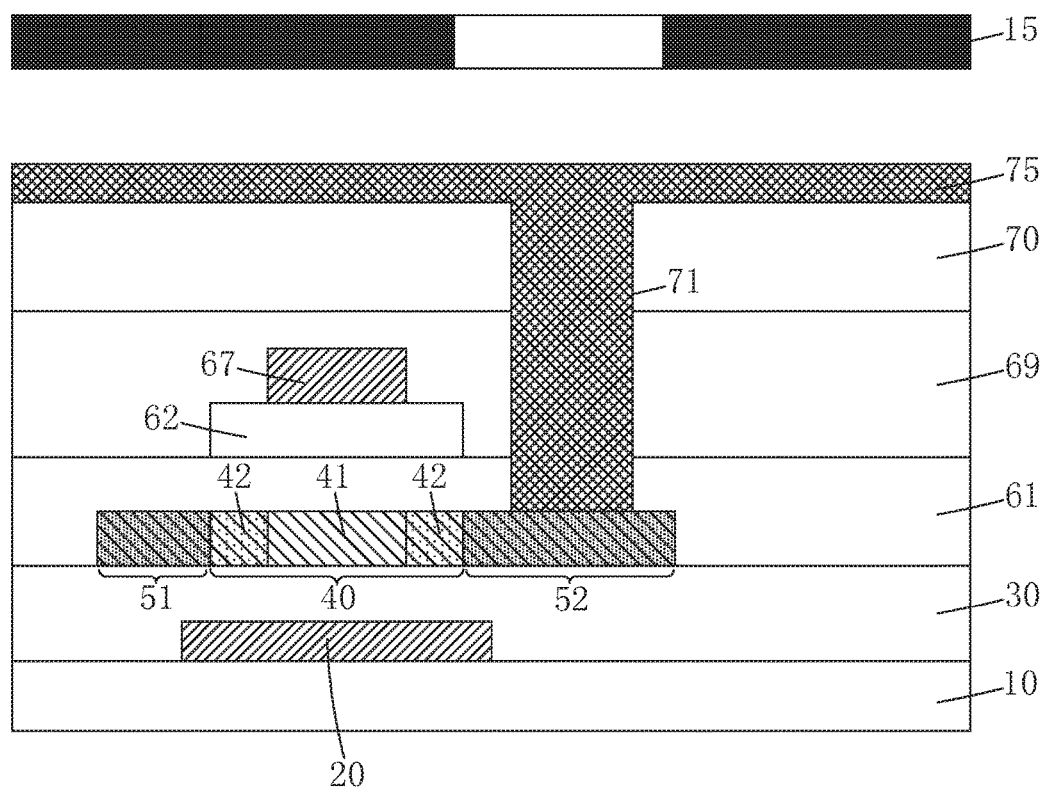
FIGS. 13 and 14 are schematic views illustrating Step 6 of the manufacturing method of the TFT substrate according to the present invention.
Figure 14:
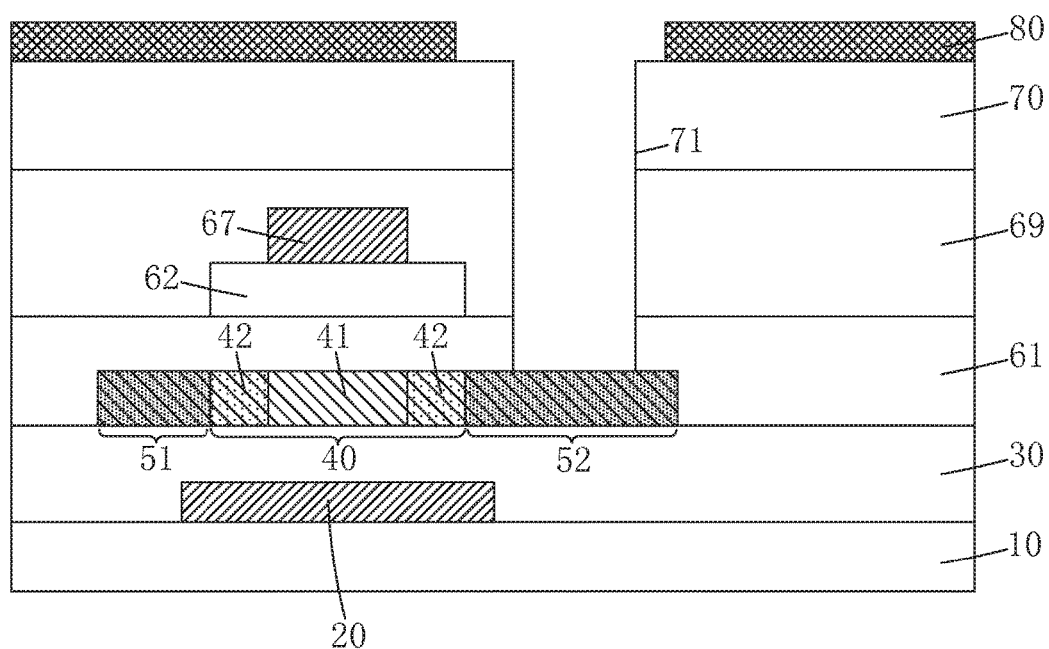

Step 6: as shown in FIGS. 13 and 14, depositing a first transparent conductive film 75 on the planarization layer 70 and using a fifth mask 15 to subject the first transparent conductive film 75 to patterning treatment so as to form a common electrode 80.

Specifically, the common electrode 80 is formed of a material comprising indium tin oxide.

Figure 15:
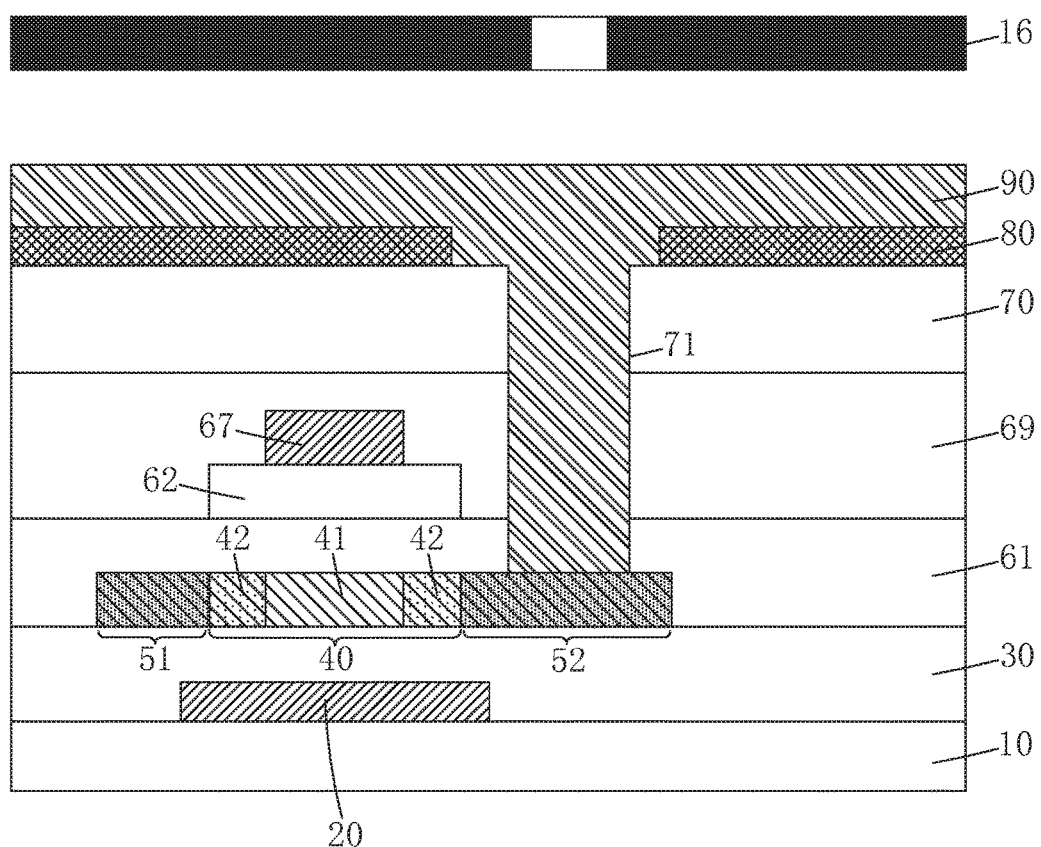
FIGS. 15 and 16 are schematic views illustrating Step 7 of the manufacturing method of the TFT substrate according to the present invention.
Figure 16:
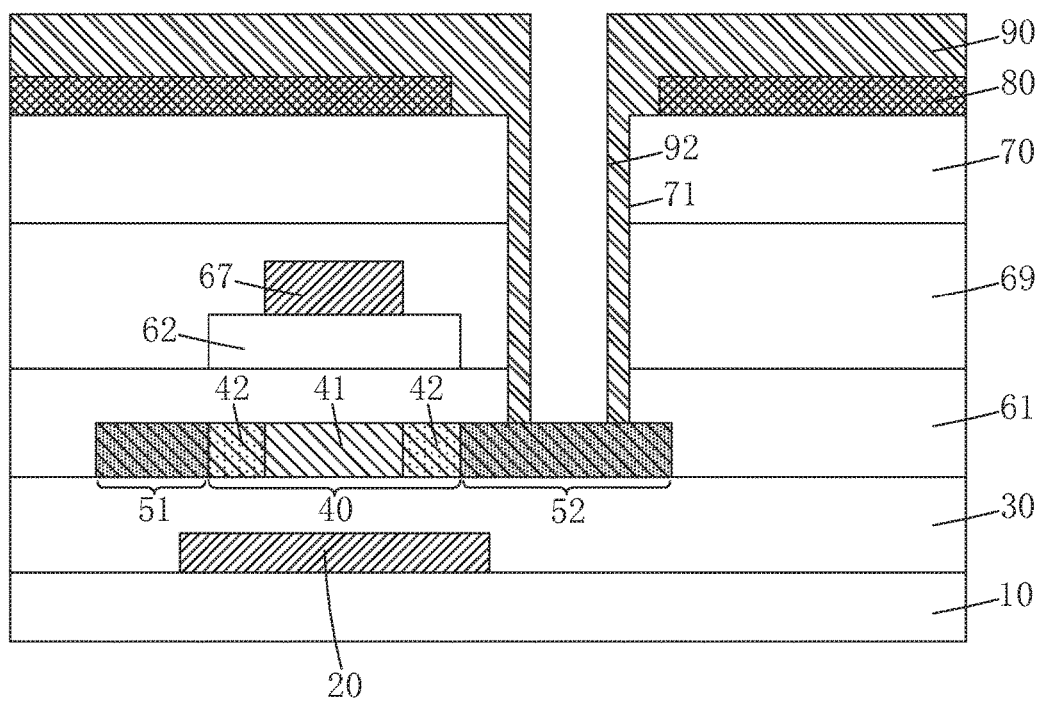

Step 7: as shown in FIGS. 15 and 16, depositing a second passivation layer 90 on the common electrode 80 and the planarization layer 70 and using a sixth mask 16 to subject the second passivation layer 90 to patterning treatment so as to form a second via 92 in the second passivation layer 90 to be located above and corresponding to the drain electrode 52 and arranged inside the first via 71.

Specifically, the second passivation layer 90 comprises a silicon nitride layer or a stacked composite layer of a silicon nitride layer and a silicon oxide layer.

Figure 17:
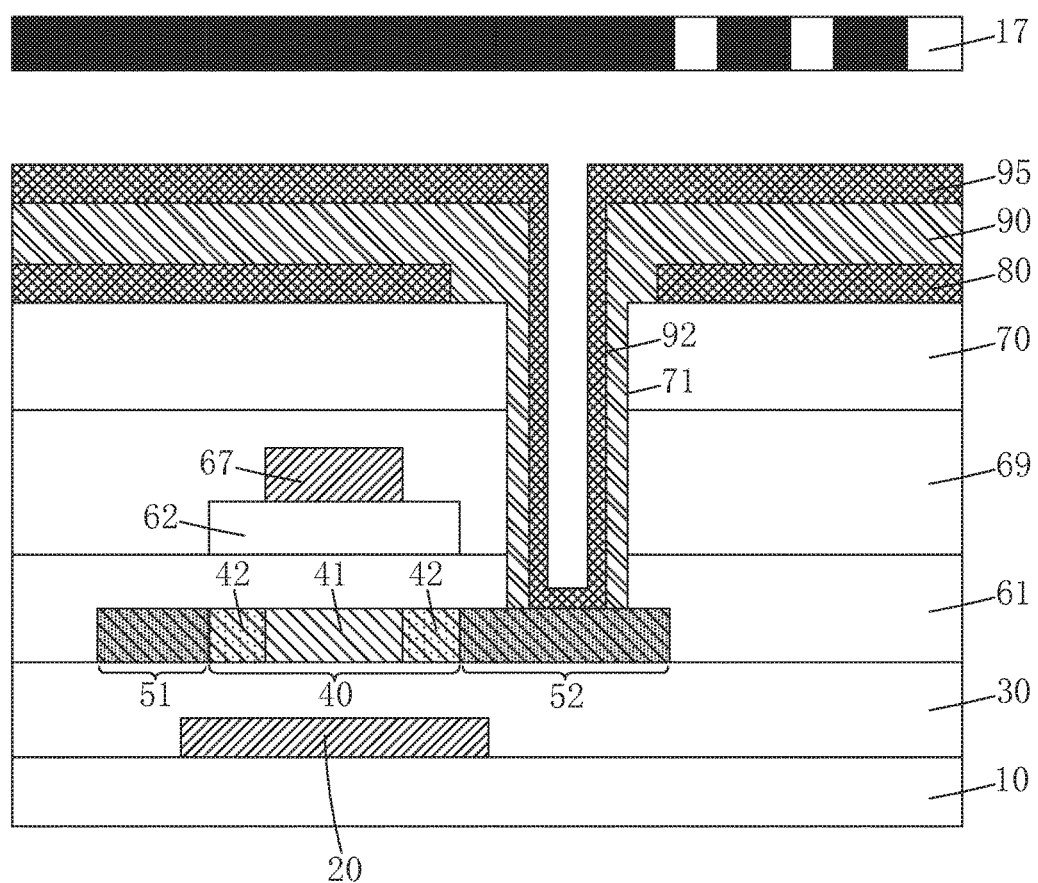
Figure 18:
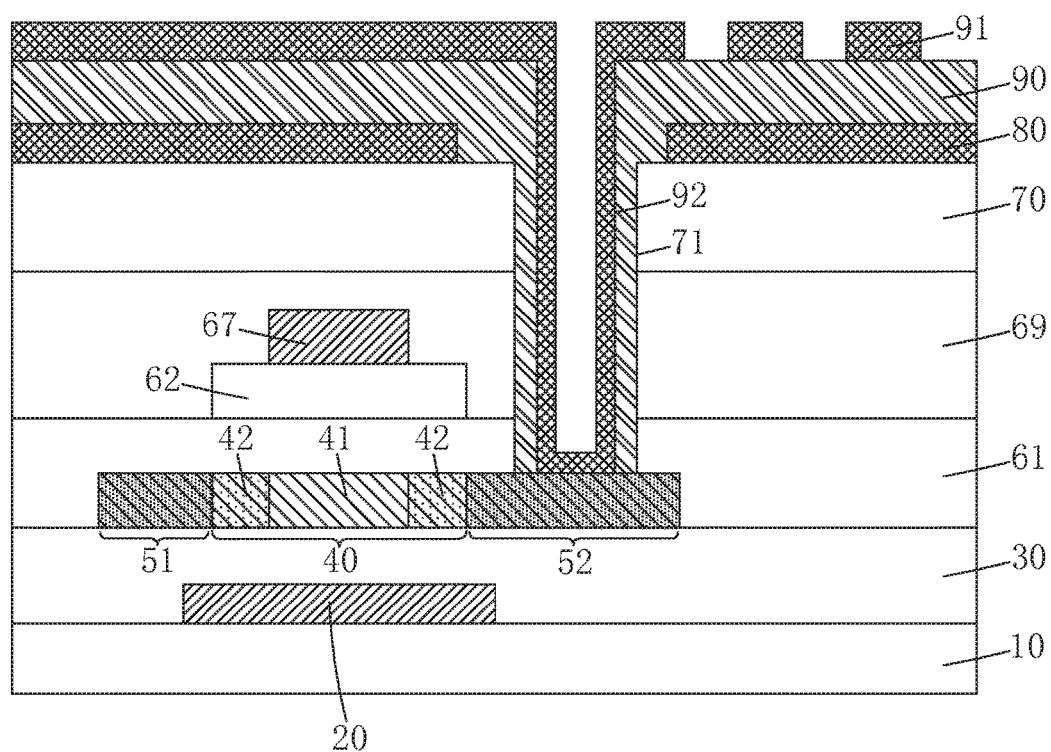

Step 8: as shown in FIGS. 17 and 18, depositing a second transparent conductive film 95 on the second passivation layer 90 and using a seventh mask 17 to subject the second transparent conductive film 95 to patterning treatment so as to form a pixel electrode 91, wherein the pixel electrode 91 is connected through the second via 92 to the drain electrode 52.

Specifically, the pixel electrode 91 is formed of a material comprising indium tin oxide.

In the above manufacturing method of the TFT substrate, a top gate structure is used to manufacture the TFT substrate. The entire process can be completely done with seven masks, and, compared to the prior art, the number of masks used is effectively reduced, the manufacturing process of the TFT substrate is simplified, and product yield is effectively increased to improve productivity. A heavy ion doping process and a light ion doping process can be simultaneously achieved with one single ion doping operation so that the manufacturing cost can be reduced. By subjecting the two ends of the semiconductor pattern 35' to heavy ion doping to form the source electrode 51 and the drain electrode 52, the manufacturing steps can be reduced and the source electrode 51 and the drain electrode 52 so formed do not need to extend through a via hole formed in an interlayer dielectric layer to get in connection with the two ends of the active layer 40 so that contact resistance can be effectively reduced and product yield is improved.

Referring to FIG. 18, based on the above-descried manufacturing method of a TFT substrate, the present invention also provides a TFT substrate, which comprises, stacked in sequence from bottom to top, a backing plate 10, a light shielding layer 20, a buffer layer 30, an active layer 40 and a source electrode 51 and a drain electrode 52, a first gate insulation layer 61, a second gate insulation layer 62, a gate electrode 67, a first passivation layer 69, a planarization layer 70, a common electrode 80, a second passivation layer 90, and a pixel electrode 91.

The source electrode 51 and the drain electrode 52 are respectively located at two opposite sides of the active layer 40 and in connection therewith. The source electrode 51 and the drain electrode 52 are both formed by subjecting a semiconductor to heavy ion doping. The active layer 40 comprises two lightly-ion-doped semiconductor layers 42 respectively located at two ends thereof and connected with the source electrode 51 and the drain electrode 52 and a channel-zone semiconductor layer 41 located between the two lightly-ion-doped semiconductor layers 42.

The first gate insulation layer 61 covers the active layer 40, the source electrode 51, the drain electrode 52, and the buffer layer 30; the second gate insulation layer 62 and the active layer 40 correspond to each other; and the gate electrode 67 and the channel-zone semiconductor layer 41 correspond to each other.

The first gate insulation layer 61, the first passivation layer 69, and the planarization layer 70 comprise a first via 71 formed therein to correspond to and be located above the drain electrode 52. The second passivation layer 90 comprises a second via 91 formed therein to correspond to and be located above the drain electrode 52 and located inside the first via 7. The pixel electrode 91 is connected through the second via 92 to the drain electrode 52.

Specifically, the backing plate 10 comprises a glass plate.

Specifically, the light shielding layer 20 and the gate electrode 67 are each formed of a material comprising at least one of molybdenum (Mo), aluminum (Al), copper (Cu), titanium (Ti), tungsten (W), and alloys thereof.

Specifically, the source electrode 51, the drain electrode 52, the lightly-ion-doped semiconductor layers 42, and the channel-zone semiconductor layer 41 are all formed of a poly-silicon layer.

Specifically, the source electrode 51, the drain electrode 52, and the lightly-ion-doped semiconductor layers 42 are doped with ions that are N-type ions, and the N-type ions are phosphorous ions.

Specifically, doping ion concentrations in the source electrode 51 and the drain electrode 52 are $1\times10^{14}$-$8\times10^{15}$ ions/cm$^3$, and doping ion concentration in the lightly-ion-doped semiconductor layers 42 is $5\times10^{12}$-$9\times10^{13}$ ions/cm$^3$.

Specifically, the first passivation layer 69 and the second passivation layer 90 each comprise a silicon nitride ($SiN_x$) layer or a stacked composite layer of a silicon nitride layer and a silicon oxide ($SiO_x$) layer.

Specifically, the planarization layer 70 is formed of a material comprising a transparent organic insulation material.

Specifically, the common electrode 80 and the pixel electrode 91 are both formed of a material comprising indium tin oxide.

In the above TFT substrate, a top gate structure is involved. The entire TFT substrate can be manufactured with seven masks, and compared to the prior art, the number of masks used is reduced, a manufacturing process of the TFT substrate is simplified, and product yield and productivity are effectively improved. The source electrode 51 and the drain electrode 52 of the TFT substrate are both formed by subjecting a semiconductor to heavy ion doping so that the manufacturing steps of the TFT substrate can be reduced and the source electrode 51 and the drain electrode 52 do not need to extend through a via hole formed in an interlayer dielectric layer to get in connection with the two ends of the active layer 40 so that contact resistance can be effectively reduces and product yield is improved.

In summary, the present invention provides a TFT substrate and a manufacturing method thereof. The manufacturing method of a TFT substrate according to the present invention uses a top gate structure to manufacture the TFT substrate. The entire process can be completely done with seven masks, and, compared to the prior art, the number of masks used is effectively reduced, the manufacturing process of the TFT substrate is simplified, and product yield is effectively increased to improve productivity. A heavy ion doping process and a light ion doping process can be simultaneously achieved with one single ion doping operation so that the manufacturing cost can be reduced. By subjecting the two ends of the semiconductor pattern to heavy ion doping to form the source electrode and the drain electrode, the manufacturing steps can be reduced and the source electrode and the drain electrode so formed do not need to extend through a via hole formed in an interlayer dielectric layer to get in connection with the two ends of the active layer so that contact resistance can be effectively reduced and product yield is improved. The TFT substrate according to the present invention provides involves a top gate structure. The entire TFT substrate can be manufactured with seven masks, and compared to the prior art, the number of masks used is reduced, a manufacturing process of the TFT substrate is simplified, and product yield and productivity are effectively improved. The source electrode and the drain electrode of the TFT substrate are both formed by subjecting a semiconductor to heavy ion doping so that the manufacturing steps of the TFT substrate can be reduced and the source electrode and the drain electrode do not need to extend through a via hole formed in an interlayer dielectric layer to get in connection with the two ends of the active layer so that contact resistance can be effectively reduces and product yield is improved.

Based on the description given above, those having ordinary skills in the art may easily contemplate various changes and modifications of he technical solution and the technical ideas of the present invention. All these changes and modifications are considered belonging to the protection scope of the present invention as defined in the appended claims.

What is claimed is:

1. A manufacturing method of a thin-film transistor (TFT) substrate, comprising the following steps:

Step 1: providing a backing plate, depositing a light shielding film on the backing plate, using a first mask to subject the light shielding film to patterning treatment so as to form a light shielding layer;

Step 2: depositing a buffer layer on the light shielding layer and the backing plate, forming a semiconductor layer on the buffer layer, and using a second mask to subject the semiconductor layer to patterning treatment so as to form a semiconductor pattern;

Step 3: depositing, in sequence, a gate insulation layer and a gate conductive film on the semiconductor pattern and the buffer layer and using a third mask to subject the gate insulation layer and the gate conductive film to exposure, development, and etching treatments;

wherein the gate conductive film, after the etching treatment, forms a gate electrode that corresponds to a middle zone of the semiconductor pattern and the gate electrode has a longitudinal cross-section that in the form of a trapezoid; and the gate insulation layer, after the etching treatment, forms a first gate insulation layer and a second gate insulation layer arranged on the first gate insulation layer, wherein the first gate insulation layer covers the semiconductor pattern and the buffer layer, and the second gate insulation layer is located on the first gate insulation layer and under the gate electrode;

Step 4: subjecting the gate electrode to etching treatment to reduce a thickness of the gate electrode in order to expose two ends of the second gate insulation layer; and using the gate electrode that has been subjected to the etching treatment in Step 4 and the second gate insulation layer to serve as a shielding mask that is used to conduct ion doping on the semiconductor pattern;

wherein two ends of the semiconductor pattern that are not shielded by the gate electrode and the second gate insulation layer are subjected to heavy ion doping so as to form a source electrode and a drain electrode; and portions of a middle zone of the semiconductor pattern that are not shielded by the gate electrode but are shielded by two ends of the second gate insulation layer are subjected to light ion doping and form lightly-ion-doped semiconductor layers; and a portion of the middle zone of the semiconductor pattern that is shielded by both the gate electrode and the second gate insulation layer is not subjected to ion doping and forms a channel-zone semiconductor layer, so that an active layer that comprises the channel-zone semiconductor layer and the lightly-ion-doped semiconductor layers is formed;

Step 5: depositing a first passivation layer on the gate electrode, the first gate insulation layer, and the second gate insulation layer, depositing a planarization layer on the first passivation layer, using a fourth mask to subject the first gate insulation layer, the first passivation layer, and the planarization layer to patterning treatment so as to form a first via in the first gate insulation layer, the first passivation layer, and the planarization layer, the first via being located above the drain electrode;

Step 6: depositing a first transparent conductive film on the planarization layer and using a fifth mask to subject the first transparent conductive film to patterning treatment so as to form a common electrode;

Step 7: depositing a second passivation layer on the common electrode and the planarization layer and using a sixth mask to subject the second passivation layer to patterning treatment so as to form a second via in the second passivation layer, the second via being located above the drain electrode and arranged inside the first via; and Step 8: depositing a second transparent conductive film on the second passivation layer and using a seventh mask to subject the second transparent conductive film to patterning treatment so as to form a pixel electrode, wherein the pixel electrode is connected through the second via to the drain electrode.

2. The manufacturing method of the TFT substrate as claimed in claim 1, wherein in Step 2, the step of forming a semiconductor layer on the buffer layer comprises: depositing an amorphous silicon layer on the buffer layer and applying a crystallization process to convert the amorphous silicon layer into a poly-silicon layer, wherein the poly-silicon layer serves as the semiconductor layer.

3. The manufacturing method of the TFT substrate as claimed in claim 1, wherein in Step 4, the semiconductor pattern is subjected to doping with N-type ions and the N-type ions used are phosphorous ions.

4. The manufacturing method of the TFT substrate as claimed in claim 1, wherein doping ion concentrations in the source electrode and the drain electrode are $1\times10^{14}$-$8\times10^{15}$ ions/cm$^3$, and doping ion concentration in the lightly-ion-doped semiconductor layers is $5\times10^{12}$-$9\times10^{13}$ ions/cm$^3$.

5. The manufacturing method of the TFT substrate as claimed in claim 1, wherein the backing plate comprises a glass plate; the light shielding layer and the gate electrode are each formed of a material comprising at least one of molybdenum, aluminum, copper, titanium, tungsten, and alloys thereof; the first passivation layer and the second passivation layer each comprise a silicon nitride layer or a stacked composite layer of a silicon nitride layer and a silicon oxide layer; the planarization layer is formed of a material comprising a transparent organic insulation material; and the common electrode and the pixel electrode are formed of materials that comprise indium tin oxide.

* * * * *